(12) United States Patent
Mullick (10) Patent No.: US 7,471,086 B2
(45) Date of Patent: Dec. 30, 2008

(54) MAGNETIC RESONANCE IMAGING VISUALIZATION METHOD AND SYSTEM

(75) Inventor: Rakesh Mullick, Karnataka (IN)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 11/788,444

(22) Filed: Apr. 20, 2007

(65) Prior Publication Data

US 2008/0258724 A1    Oct. 23, 2008

(51) Int. Cl.
*G01V 3/00*    (2006.01)
(52) U.S. Cl. ........................ 324/309; 324/307
(58) Field of Classification Search ......... 324/300–322; 600/407–422
See application file for complete search history.

(56) References Cited

U.S. PATENT DOCUMENTS

| | | | | |
|---|---|---|---|---|
| 4,970,457 | A | * | 11/1990 | Kaufman et al. ............. 324/309 |
| 5,073,752 | A | * | 12/1991 | DeMeester et al. .......... 324/309 |
| 7,180,293 | B2 | * | 2/2007 | Kanda ........................ 324/318 |
| 2005/0054910 | A1 | * | 3/2005 | Tremblay et al. ........... 600/411 |
| 2008/0021304 | A1 | * | 1/2008 | Stemmer ..................... 600/410 |

OTHER PUBLICATIONS

Ramaswamy et al : Application of multi-transforms to 3-D spatial signals representation; IEEE 1995, pp. 749-753.*

Brant-Zawadzki, Michael, MD, et al., MP Rage: A Three-Dimensional, T1-weighted, Gradient-Echo Sequence—Initial Experience in the Brain, Radiology 1992, pp. 182-775.

Entezari, Alireza, et al., Shading For Fourier Volume Rendering, 2002 IEEE symposium on Volume visualization and graphics, 2002, 8 pp.

Fender, Josh, Fourier Volume Rendering, CSC2522: Advance Image Synthesize, May 23, 2002, 5 pp.

Levoy, Marc, Volume Rendering Using the Fourier Projection-Slice Theorem, Technical Report: CSL-TR-92-521, Apr. 1992, Computer Systems Laboratory, Department of Electrical Engineering and Computer Science, Stanford University, Stanford, California 94305-4033, 11 pp.

Malzbender, Tom, Fourier Volume Rendering, ACM Transactions on Graphics, vol. 12, No. 3, Jul. 1993, pp. 233-250.

Mugler, John P., III, PhD, Optimized Single-Slab Three-Dimensional Spin-Echo MR Imaging of the Brain, Radiology 2000; vol. 216, pp. 891-899.

* cited by examiner

*Primary Examiner*—Brij B Shrivastav
(74) *Attorney, Agent, or Firm*—Fletcher Yoder (57) ABSTRACT

The present technique provides a system and method for processing an image. Particularly the method comprises acquiring image data in frequency space (k-space) of an imaged volume and obtaining a three-dimensional (3-D) k-space volume representative of the imaged volume based on the acquired k-space data. The method further comprises selecting a two-dimensional (2-D) plane from the 3-D k-space volume and applying an inverse Fourier transform to the selected 2-D plane to obtain a real 2-D X-ray-like (or enhanced rendering) projection of the imaged volume offering insights into the 3-D data.

20 Claims, 5 Drawing Sheets

MAGNETIC RESONANCE IMAGING VISUALIZATION METHOD AND SYSTEM

BACKGROUND

The invention relates generally to image processing. Particularly, this invention relates to a volume rendering techniques used in magnetic resonance imaging (MRI).

MRI systems have become ubiquitous in the field of medical diagnostics. In general, MRI imaging techniques are based on the interactions among a primary magnetic field, a radiofrequency (rf) field and time varying magnetic gradient fields that combine to influence nuclear spins within the subject of interest. Specific nuclear components, such as hydrogen nuclei in water molecules, have characteristic behaviors in response to external magnetic fields. The precession of spins of such nuclear components can be influenced by manipulation of the fields to obtain rf signals that can be detected, processed, and used to reconstruct a useful image.

The magnetic fields used to produce images in MRI systems include a highly uniform, static magnetic field that is produced by a primary magnet. A series of gradient fields are produced by a set of three gradient coils disposed around the subject. The gradient fields encode positions of individual volume elements or voxels in three dimensions. A radiofrequency coil is employed to produce an rf magnetic field, typically pulsed to create the required resonance signals. This rf magnetic field perturbs the spin system from its equilibrium condition, in which the spins precess at desired phases and frequencies. In response to the perturbation, the gyromagnetic materials emit rf signals that are detected by either the same transmitting rf coil, or by a separate receive-only coil. These signals are amplified, filtered, and digitized. The digitized signals are then processed using one of several possible reconstruction algorithms to reconstruct a useful image.

Many specific techniques have been developed to acquire MR images for a variety of applications. Typically, MR image processing entails multiple steps, one of which may involve reconstructing a three-dimension (3D) volume by using a mathematical transform such as a Fast Fourier Transform (FFT). The FFT is used to convert data in the frequency domain, otherwise known as k-space, into spatial domain data from which an image may be constructed. Constructed images may appear as 2-D slices of 3-D volumes, showing internal anatomical features in 2-D. Similarly, 3-D images may also be formed, however, such constructions directly from k-space are unfortunately computationally laborious and, therefore, quite lengthy. This is primarily due to the implementation of the FFT to a large k-space data set needed to reconstruct a 3-D image of an imaged volume. Moreover, applying image enhancing and image processing techniques, such as ray casting, shaded volume rendering, background contrast and so forth, after the 3-D image is constructed can be very lengthy as well. This is particularly so when some of the feature-enhancing methods require transforming the 3-D volume data back to the original k-space for further data manipulation. In some instances, the data may be transformed multiple times between frequency and spatial coordinate space before a final image is rendered, further increasing the computational time of the image processing.

Thus, there is a need for a system and method which reduces the amount of image processing time, particularly in converting k-space data into 2-D image data which ultimately forms a useful image. Further, there is a need for near real-time volume rendering methods in MRI, enabling rapid visualization of 2-D images generated from data MR data, some of which may be performed during an imaging procedure.

BRIEF DESCRIPTION

The present technique provides for rapid visualization of MR data sets enabling near real-time rendering of MR images on, for example, an MR console. The present technique leverages access to k-space data during acquisition of the data sets to implement the Fourier projection-slice theorem. Accordingly, volume rendering is achieved by acquiring k-space MR data sets which are acted on upon by a mathematical transform, such as an inverse fast Fourier transform (IFFT), together with the Fourier projection-slice theorem. This method enables obtaining projection images such that 2-D image rendering can be achieved rapidly. Further, the method enables manipulating the k-space data so that feature enhancing techniques, such shaded volume rendering and ray casting, can be implemented directly without transforming the MR image data between k-space and spatial coordinates multiple times.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
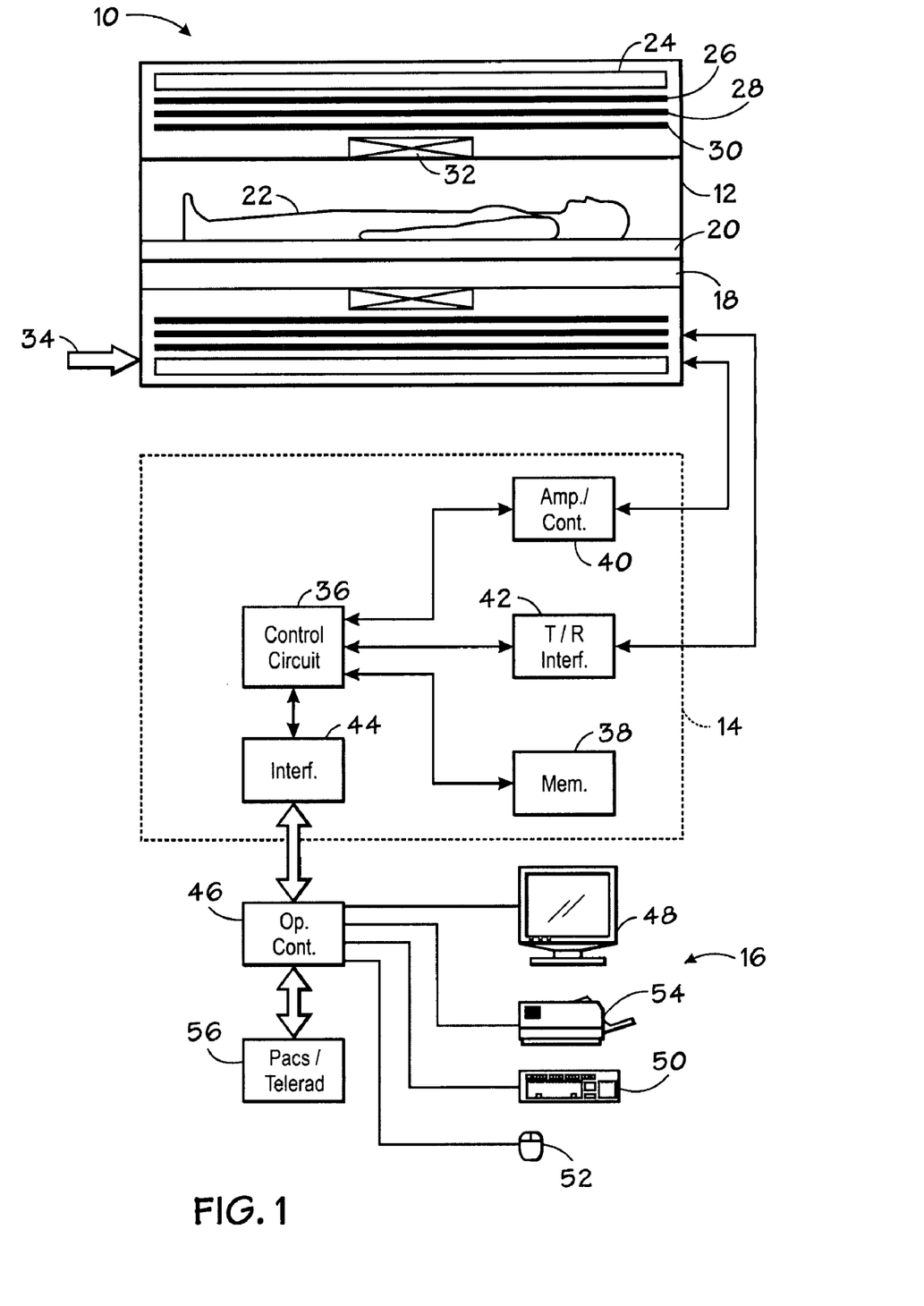
FIG. 1 is a diagrammatical representation of an MRI system for use in medical diagnostic imaging and implementing certain aspects of the present image data processing technique.

Turning now to the drawings, and referring first to FIG. 1, a magnetic resonance imaging (MRI) system 10 is illustrated diagrammatically as including a scanner 12, scanner control circuitry 14, and system control circuitry 16. As further discussed below, MRI system 10 may be adapted to initially acquire two and three-dimensional image data in k-space from which projection images of an imaged object may be formed using the Fourier projection-slice theorem.

While MRI system 10 may include any suitable MRI scanner or detector, in the illustrated embodiment the system includes a full body scanner comprising a patient bore 18 into which a table 20 may be positioned to place a patient 22 in a desired position for scanning. Scanner 12 may be of any suitable type of rating, including scanners varying from 0.5 Tesla ratings to 1.5 Tesla ratings and beyond.

Scanner 12 includes a series of associated coils for producing controlled magnetic fields, for generating radiofrequency excitation pulses, and for detecting emissions from gyromagnetic material within the patient in response to such pulses. In the diagrammatical view of FIG. 1, a primary magnet coil 24 is provided for generating a primary magnetic field generally aligned with patient bore 18. A series of gradient coils 26, 28 and 30 are grouped in a coil assembly for generating controlled magnetic gradient fields during examination sequences as described more fully below. As will be appreciated by those skilled in the art, such coils ultimately enable choosing what are know as "slices" providing oblique angle views of the imaged object.

A radiofrequency coil 32 is provided for generating radiofrequency pulses for exciting the gyromagnetic material. In the embodiment illustrated in FIG. 1, coil 32 also serves as a receiving coil. Thus, rf coil 32 may be coupled with driving and receiving circuitry in passive and active modes for receiving emissions from the gyromagnetic material and for applying radiofrequency excitation pulses, respectively. Alternatively, various configurations of receiving coils may be provided separate from rf coil 32. Such coils may include structures specifically adapted for target anatomies, such as head coil assemblies, and so forth. Moreover, receiving coils may be provided in any suitable physical configuration, including phased array coils, and so forth. Generally, and as described more fully below, time varying RF signals acquired by coil 32 populate a 2-D k-space region from which spatial information of the imaged object can be obtained by mathematically manipulating the k-space data of the imaged object.

In a present configuration, the gradient coils 26, 28 and 30 have different physical configurations adapted to their function in the imaging system 10. As will be appreciated by those skilled in the art, the coils are comprised of conductive wires, bars or plates which are wound or cut to form a coil structure which generates a gradient field upon application of control pulses as described below. The placement of the coils within the gradient coil assembly may be done in several different orders, but in the present embodiment, a Z-axis coil is positioned at an innermost location, and is formed generally as a solenoid-like structure which has relatively little impact on the rf magnetic field. Thus, in the illustrated embodiment, gradient coil 30 is the Z-axis solenoid coil, while coils 26 and 28 are Y-axis and X-axis coils respectively.

The coils of scanner 12 are controlled by external circuitry to generate desired fields and pulses, and to read signals from the gyromagnetic material in a controlled manner. As will be appreciated by those skilled in the art, when the material, typically bound in tissues of the patient, is subjected to the primary field, individual magnetic moments of the paramagnetic nuclei in the tissue partially align with the field. While a net magnetic moment is produced in the direction of the polarizing field, the randomly oriented components of the moment in a perpendicular plane generally cancel one another. During an examination sequence, an rf frequency pulse is generated at or near the Larmor frequency of the material of interest, resulting in rotation of the net aligned moment to produce a net transverse magnetic moment. This transverse magnetic moment precesses around the main magnetic field direction, emitting rf signals that are detected by the scanner and processed for reconstruction of the desired image.

Gradient coils 26, 28 and 30 serve to generate precisely controlled magnetic fields, the strength of which vary over a predefined field of view, typically with positive and negative polarity. When each coil is energized with known electric current, the resulting magnetic field gradient is superimposed over the primary field and produces a desirably linear variation in the Z-axis component of the magnetic field strength across the field of view. The field varies linearly in one direction, but is homogenous in the other two. The three coils have mutually orthogonal axes for the direction of their variation, enabling a linear field gradient to be imposed in an arbitrary direction with an appropriate combination of the three gradient coils.

The pulsed gradient fields perform various functions integral to the imaging process. Some of these functions are slice selection, frequency encoding and phase encoding. These functions can be applied along the X, Y and Z axis of the original coordinate system or along other axes determined by combinations of pulsed currents applied to the individual field coils.

The slice select gradient determines a slab of tissue or anatomy to be imaged in the patient. The slice select gradient field may be applied simultaneously with a frequency selective rf pulse to excite a known volume of spins within a desired slice that precess at the same frequency. The slice thickness is determined by the bandwidth of the rf pulse and the gradient strength across the field of view.

The frequency encoding gradient is also known as the readout gradient, and is usually applied in a direction perpendicular to the slice select gradient. In general, the frequency encoding gradient is applied before and during the formation of the MR echo signal resulting from the rf excitation. Spins of the gyromagnetic material under the influence of this gradient are frequency encoded according to their spatial position along the gradient field. By Fourier transformation, acquired signals may be analyzed to identify their location in the selected slice by virtue of the frequency encoding. As further described below, further analysis, such as applying the Fourier Projection-slice theorem to the Fourier transformed data, enables choosing slices of the imaged object which can be combined to render 3-D images of the imaged object.

Finally, the phase encode gradient is generally applied before the readout gradient and after the slice select gradient. Localization of spins in the gyromagnetic material in the phase encode direction is accomplished by sequentially inducing variations in phase of the precessing protons of the material using slightly different gradient amplitudes that are sequentially applied during the data acquisition sequence. The phase encode gradient permits phase differences to be created among the spins of the material in accordance with their position in the phase encode direction.

As will be appreciated by those skilled in the art, a great number of variations may be devised for pulse sequences employing the exemplary gradient pulse functions described above as well as other gradient pulse functions not explicitly described here. Moreover, adaptations in the pulse sequences may be made to appropriately orient both the selected slice and the frequency and phase encoding to excite the desired material and to acquire resulting MR signals for processing.

The coils of scanner 12 are controlled by scanner control circuitry 14 to generate the desired magnetic field and radiofrequency pulses. In the diagrammatical view of FIG. 1, control circuitry 14 thus includes a control circuit 36 for commanding the pulse sequences employed during the examinations, and for processing received signals. Control circuit 36 may include any suitable programmable logic device, such as a CPU or digital signal processor of a general purpose or application-specific computer. Control circuit 36 further includes memory circuitry 38, such as volatile and non-volatile memory devices for storing physical and logical axis configuration parameters, examination pulse sequence descriptions, acquired image data, programming routines, and so forth, used during the examination sequences implemented by the scanner.

Interface between the control circuit 36 and the coils of scanner 12 is managed by amplification and control circuitry 40 and by transmission and receive interface circuitry 42. Circuitry 40 includes amplifiers for each gradient field coil to supply drive current to the field coils in response to control signals from control circuit 36. Interface circuitry 42 includes additional amplification circuitry for driving rf coil 32. Moreover, where the rf coil serves both to emit the radiofrequency excitation pulses and to receive MR signals, circuitry 42 will typically include a switching device for toggling the rf coil between active or transmitting mode, and passive or receiving mode. A power supply, denoted generally by reference numeral 34 in FIG. 1, is provided for energizing the primary magnet 24. Finally, circuitry 14 includes interface components 44 for exchanging configuration and image data with system control circuitry 16. It should be noted that, while in the present description reference is made to a horizontal cylindrical bore imaging system employing a superconducting primary field magnet assembly, the present technique may be applied to various other configurations, such as scanners employing vertical fields generated by superconducting magnets, permanent magnets, electromagnets or combinations of these means.

System control circuitry 16 may include a wide range of devices for facilitating interface between an operator or radiologist and scanner 12 via scanner control circuitry 14. In the illustrated embodiment, for example, an operator controller 46 is provided in the form of a computer work station employing a general purpose or application-specific computer. The station also typically includes memory circuitry for storing examination pulse sequence descriptions, examination protocols, user and patient data, image data, both raw and processed, and so forth. The station may further include various interface and peripheral drivers for receiving and exchanging data with local and remote devices. In the illustrated embodiment, such devices include a conventional computer keyboard 50 and an alternative input device such as a mouse 52. A printer 54 is provided for generating hard copy output of documents and images reconstructed from the acquired data. A computer monitor 48 is provided for facilitating operator interface. In addition, system 10 may include various local and remote image access and examination control devices, represented generally by reference numeral 56 in FIG. 1. Such devices may include picture archiving and communication systems, teleradiology systems, and the like.

Figure 2:
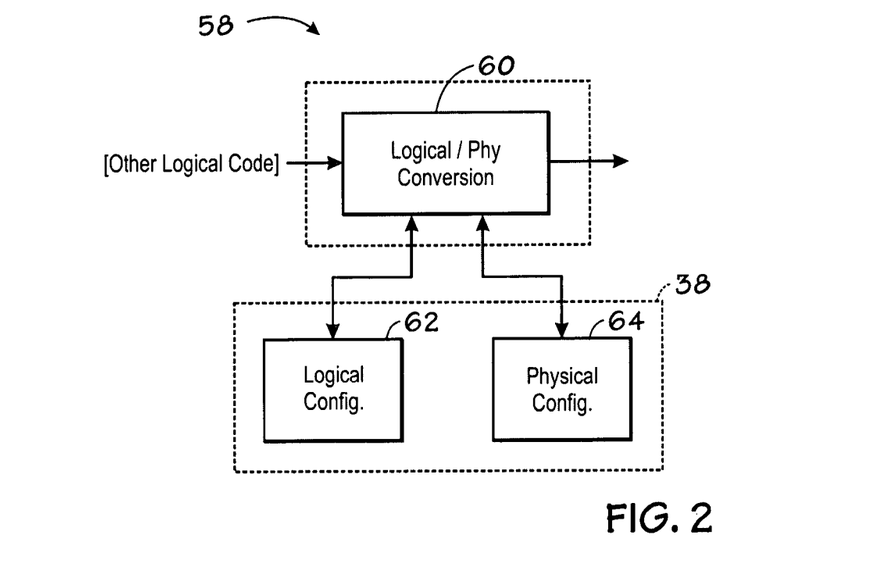
FIG. 2 is a block diagram of functional components for converting logical axis to physical axis orientations in a controller for a system of the type illustrated in FIG. 1 permitting the acquisition of k-space data for a volume of interest.

In general, pulse sequences implemented in the MRI system will be defined by both functional and physical configuration sets and parameter settings stored within control circuitry 14. FIG. 2 represents, diagrammatically, relationships between functional components of control circuit 36 and configuration components stored with memory circuitry 38. The functional components facilitate coordination of the pulse sequences to accommodate preestablished settings for both functional and physical axes of the system. In general, the axis control modules, denoted collectively by reference numeral 58, include a functional-to-physical conversion module 60 which is typically implemented via software routines executed by control circuit 36. In particular, the conversion module is implemented through control routines that define particular pulse sequences in accordance with preestablished imaging protocols.

When called upon, code defining the conversion module references functional sets 62 and physical configuration sets 64. The functional configuration sets may include parameters such as pulse amplitudes, beginning times, time delays, and so forth, for the various logical axes described above. The physical configuration sets, on the other hand, will typically include parameters related to the physical constraints of the scanner itself, including maximum and minimum allowable currents, switching times, amplification, scaling, and so forth. Conversion module 60 serves to generate the pulse sequence for driving the coils of scanner 12 in accordance with constraints defined in these configuration sets. The conversion module will also serve to define adapted pulses for each physical axis to properly orient (e.g. rotate) slices and to encode gyromagnetic material in accordance with desired rotation or reorientations of the physical axes of the image. Such rotation may assist in populating the acquired k space data set, as indicated when references to FIGS. 4 and 5 for application of the Fourier projection-slice theory such that 2-D projection images can be rapidly generated directly from the k space data.

Figure 3:
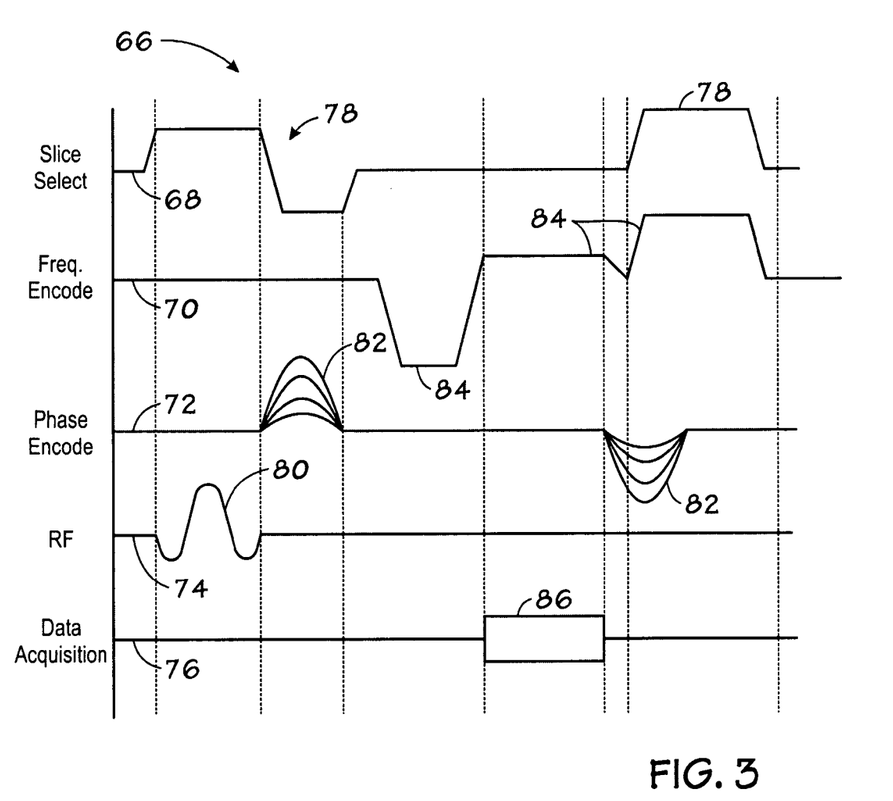
FIG. 3 is a graphical representation of an exemplary pulse sequence description for an MRI examination which may be implemented in the system of FIG. 1.

By way of example, FIG. 3 illustrates a typical pulse sequence which may be implemented on a system such as that illustrated in FIG. 1 and calling upon configuration and conversion components such as those shown in FIG. 2. While many different pulse sequence definitions may be implemented, depending upon the examination type, in the example of FIG. 3, a gradient recalled acquisition in steady state mode (GRASS) pulse sequence is defined by a series of pulses and gradients appropriately timed with respect to one another. The pulse sequence, indicated generally by reference numeral 66, is thus defined by pulses on a slice select axis 68, a frequency encoding axis 70, a phase encoding axis 72, an rf axis 74, and a data acquisition axis 76. In general, the pulse sequence description begins with a pair of gradient pulses on slice select axis 68 as represented at reference numeral 78. During a first of these gradient pulses, an rf pulse 80 is generated to excite gyromagnetic material in the subject. Phase encoding pulses 82 are then generated, followed by a frequency encoding gradient 84. A data acquisition window 86 provides for sensing signals resulting from the excitation pulses which are phase and frequency encoded. The pulse sequence description terminates with additional gradient pulses on the slice select, frequency encoding, and phase encoding axes.

Figure 4:
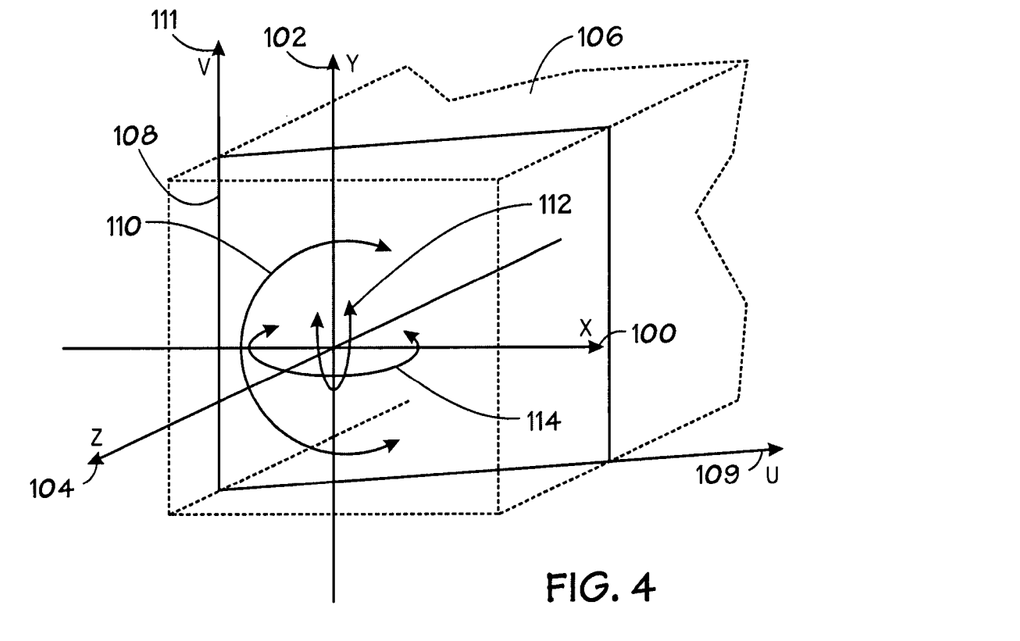
FIG. 4 illustrates movement of a projected imaging plane in spatial coordinate space in accordance with an embodiment of the present technique.

Turning now to FIG. 4, a diagrammatical view of a 2-D plane is illustrated as a slice through a 3-D volume in accordance with an exemplary embodiment of the present technique. Generally, using one or more of the above MR pulse sequences it may be possible to acquire images along various planes of the imaged object. That is, depending on the gradient coils, MR images form 2-D slices along an axis parallel to the imaged object. In certain situations it may be desirable to employ multi-angle oblique imaging, whereby 2-D images having various degrees of obliquity with respect to the principle axis of the MR system are acquired.

Accordingly, FIG. 4 depicts three principle perpendicular axes, namely, X, Y and Z, labeled 100, 102 and 104, respectively, all of which are perpendicular to one another. In the illustrated embodiment, Z-axis 104 may be regarded as the axis parallel to the constant MR magnetic field. The figure further illustrates volume 106 having a plane 108 generally intersecting the volume at some general oblique angle. Volume 106 may represent an object from which real 2-D projections, characterized by plane 108, are obtained using the Fourier projection slice theorem, as described further below. Plane 108 may be characterized by a two dimensional coordinate system, namely, a real coordinate system having axes U-109 and V-111. The coordinates 109 and 111 define the direction of plane/projection 108 relative to the volume 106, which is characterized by the parameters X, Y and Z. It should be borne in mind that the direction of plane 108 corresponds to a user chosen angle through which imaged volume 106 is viewed at during, for example, a diagnostic study of a patient. As will be discussed further below, projection 108 is obtained along the chosen direction, as specified by U-109 and V-111, by initially choosing a corresponding plane in k-space whose inverse 2D (or n−1 D) Fourier transform renders a desired X-ray like oblique view of volume 106, as prescribed by the Fourier projection slice theorem.

Further shown in FIG. 4 are arrows 110-114 generally depicting the manner by which plane 108 can rotate in 3-D. That is, arrows 110-114 illustrate different angular positions plane 108 may attain in rendering different angular/oblique X-ray like views of volume 106, as may be desired by a user. Particularly, arrow 110 depicts rotation of plane 108 in the XY plane, that is, about Z-axis 104, and arrow 112 depicts rotation of plane 108 in the YZ plane (or about the X-axis). Similarly, arrow 114 depicts rotation of plane 108 in the XZ plane, i.e., about Y-axis 102. Thus, plane 108 can be rotated almost through any desirable angle about any of the aforementioned axes. As will be appreciated by those of ordinary skill in the art, such a rotation of plane 108 constitutes an Euler rotation in 3-D, decomposable into a superposition of rotations defined by arrows 110-114. While in the illustrated embodiment plane 108 is rotated such that it is obliquely disposed relative to the XY-plane 104, other embodiments may include disposing plane 108 at oblique angles relative to the YZ-plane, the XZ-plane or any combination of the aforementioned planes.

As will be appreciated to those skilled in the art, acquiring MR data may be implemented through various modes, one of which is known as MR multi-channel acquisition, whereby a combination of hardware and software platforms are used to acquire and process image data to ultimately construct 3-D k-space data. Accordingly, techniques for obtaining the 3-D k-space data may include spin-echo, single slab using T1 and T2 weighted images with increased volume resolution. Other techniques may involve magnetization-prepared 180 degrees radio frequency pulses and rapid gradient echo sampling. Once 3-D k-space data of an imaged object is obtained, applying the Fourier projection-slice theorem along desired 2-D k-space planes selected from the 3-D k-space renders real 2-D projections intersecting along oblique planes of the imaged volume, as shown by plane 108 intersecting volume 106. Further, as will be appreciated by those skilled in the art existing MR scanners are typically adapted, after data reconstruction, to provide 2-D k-space information. Using a separability property of the coordinates (e.g., X, Y and Z) in the discrete and/or fast Fourier transforms DFT/FFT, it is possible to assemble a collection of 2-D FFTs (2D k-spaces corresponding to 2-D slices of a volume) so as to create a 3-D distribution. This may be achieved by performing a 1-D DFT/FFT on the stack formed by 2-D slices and combining those to form a 3-D k-space data distribution. In other words, if A is a volume element formed by a stack of 2-D slices, then operating with a three-dimensional 3-D FFT/DFT on A is equivalent to performing a one dimensional FFT/DFT on B, where B is a stack of 2-D FFTs/DFTs of sequential slices of volume element A. The above procedure can simply be summarized by the following mathematical relation: 3-D FFT(A)=1-D FFT(B). In so doing, it may be possible to interpolate 3-D MR k-space data from which 2-D planes may be selected.

Once the 3-D k-space data is obtained, as may be achieved using one or more of the above methods, the Fourier projection-slice theorem may be applied repeatedly to the 3-D k-space data along selected planes such that each plane is ultimately transformed into a 2-D X-ray like projection of the imaged volume, thereby offering multi-angle viewing of the imaged volume. Employing such a technique may be more computationally feasible than other computational schemes which would otherwise require, for example, performing an IFFT for the entire 3-D k-space data to obtain real 3-D images from which projection images may ultimately be obtained.

Figure 5:
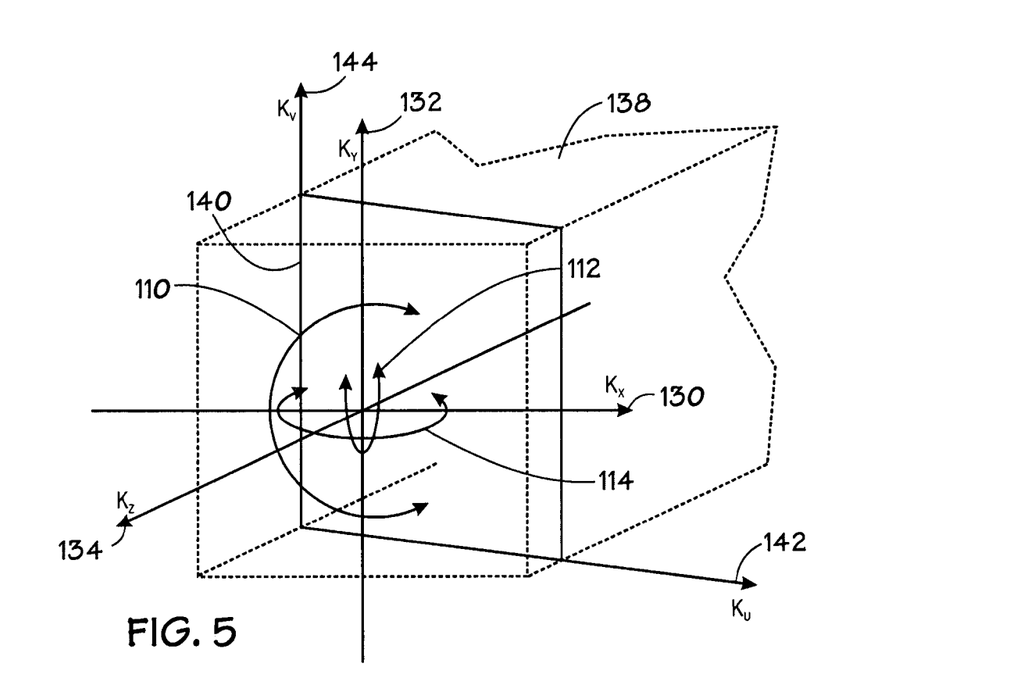
FIG. 5 illustrates movement of the same image plane in frequency coordinate space in accordance with an embodiment of the present technique.

Accordingly, FIG. 5 generally depicts the manner in which the Fourier projection-slice theorem may be applied to construct real 2-D projection images directly from acquired 3-D k-space data, in accordance with an embodiment of the present technique. Accordingly, FIG. 5 includes a three-dimensional axis system in k-space, labeled by axes $K_x$, $K_y$, and $K_z$, referenced by numerals 130, 132 and 134, respectively. The figure further depicts a 3-D volume 138 representing 3-D k-space data of an imaged volume/object, such as volume 106 (FIG. 4) or portions thereof. The 3-D k-space data may be mathematically represented as a function of the parameters $K_x$, $K_y$, and $K_z$ as the following:

$$\text{3-D } k\text{-space data Function} = F(K_x, K_y, K_z) \quad \text{Equation (1)}$$

Equation (1) is mathematically related to the real image data obtained from the volume 106 by the following relation:

$$f(X, Y, Z) = \int_{-\infty}^{\infty}\int_{-\infty}^{\infty}\int_{-\infty}^{\infty} F(K_k + K_y + K_z)e^{-2\pi i(K_x X + K_y Y + K_z Z)} dK_x dK_y dK_z \quad \text{Equation (2)}$$

Where $f(X, Y, Z)$ is the image density function of volume 106. That is, the image density function is obtained by applying an inverse Fourier transform to $F(K_x, K_y, K_z)$ of Equation (1). It should be noted that other inverse transforms, such as a Hartley transform and/or a discrete cosine transform, may also be employed in a relation similar to that shown in Equation (1) to obtain $f(X, Y, Z)$ from $F(K_x, K_y, K_z)$.

As further illustrated in FIG. 5, a plane 140 is shown to intersect volume 138 at an oblique angle. Accordingly, plane 140 is formed of 2-D k-space data chosen from the 3-D k-space data function $F(K_x, K_y, K_z)$ (e.g., Equation (1)) for constructing, via the Fourier projection slice theorem, a real 2-D projection of an imaged volume. Thus, plane 140 may be chosen such that its direction relative to k-space volume 138 indirectly corresponds to the direction of the real 2-D projection of the imaged volume, as pertaining to plane 108 and volume 106, respectively. As such, plane 140 may be characterized by a 2-D coordinate system having axes $K_u$, $K_v$, referenced by numerals 142 and 144, respectively. While in the illustrated embodiment plane 140 intersects the volume 138 at a specific oblique angle, other embodiments may include intersections of volume 138 by plane 140 at other oblique angles to the extent imaging at such angles is feasible in providing useful anatomical information. Accordingly, choosing k-spaced data points to define plane 140, the plane may be mathematically parameterized/defined as the following:

$$\text{Selected 2-D } k\text{-space Plane} = P(K_u, K_v) \quad \text{Equation (3)}$$

That is plane 140 may be parameterized by the axes $K_u$ and $K_v$. Thus, the parameters U and V in $K_u$ and $K_v$, as shown in Equation 3, define the direction and/or orientation of plane 140 with respect to volume 138, as freely chosen, for example, by a user.

As mentioned above, projections, such as the projection P (e.g., Equation (3)), may be chosen along planes pointing at various directions, as would be implemented in continuous sequential acquisitions of projections of volume 106 (FIG. 4), such that plane 140 may be continuously rotated throughout volume 138. To obtain desired real 2-D projected images of volume 106, an IFFT may be applied to P($K_u$, $K_v$), i.e., Equation (3), such that a real projection p(U, V) is obtained by the following:

$$p(U, V) = \int_{-\infty}^{\infty}\int_{-\infty}^{\infty} P(K_u, K_v)e^{-2\pi i(K_u U + K_v V)} dK_u dK_v \quad \text{Equation (4)}$$

Hence, Equation (3) gives the projection p (U, V,) representing a real 2-D X-ray-like projection of an imaged volume, along a desired direction. Stated otherwise, the real projection p (U, V) attains an orientation/direction relative to an imaged volume in a manner similar to that shown by plane 108 disposed relative to volume 106, as described above in FIG. 4. Hence, applying the IFFT, e.g., Equation (4), to a selected 2-D plane in k-space, e.g., Equation (3), enables to obtain a view of an imaged volume at a desired oblique angle. It should be borne in mind that the resulting viewing angle provided by the projection p(U, V) is determined by the manner plane 140, e.g., Equation (3), is defined, i.e., the manner by which the k-space data sets of P($K_u$, $K_v$) are selected. Further, using the above method repeatedly, multiple planes, such as plane 140, may be sequentially selected and repeatedly defined by Equation (3), to yield sequential 2-D k-space slices of volume 138, which then can be transformed using, for example, IFFT to yield sequential 2-D real projection images of volume 106 at correspondingly different view angles.

Figure 6:
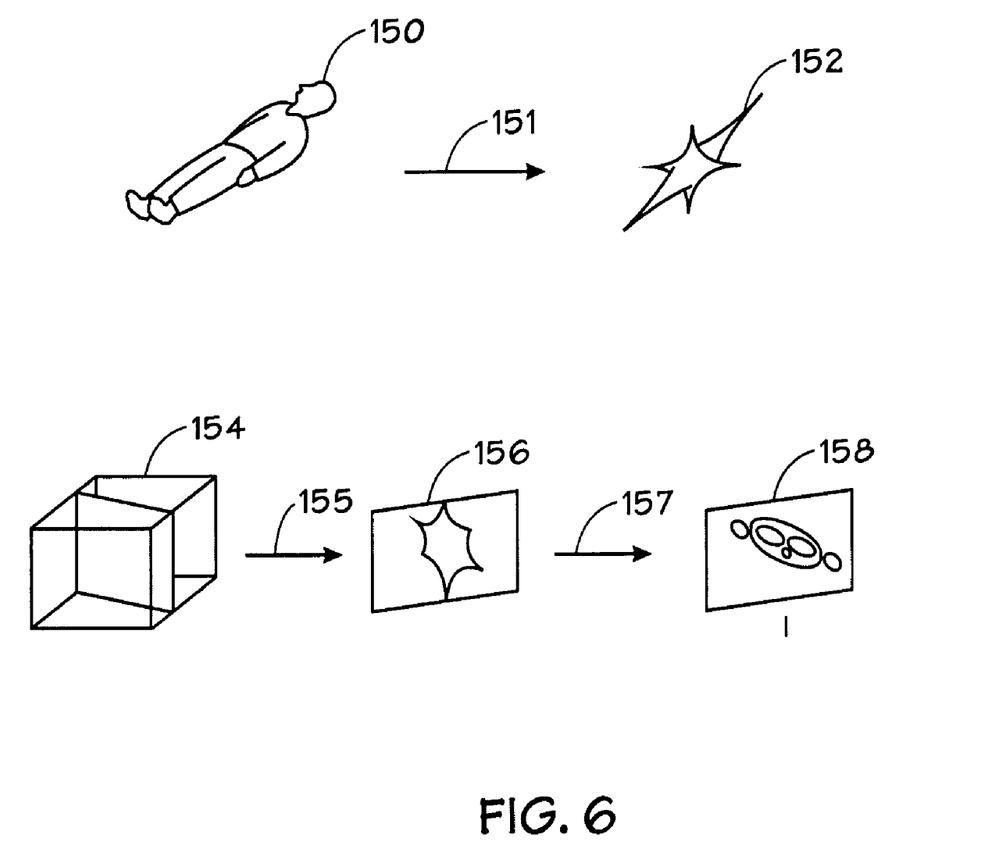
FIG. 6 is a pictorial illustration of a method of obtaining real image projections in accordance with an embodiment of the present technique.

FIG. 6 is an illustration generally depicting the method of applying the Fourier projection slice theorem to obtain real image projections of an imaged object by directly leveraging 3D k-space data, in accordance with an embodiment of the present technique. Accordingly, FIG. 6 depicts an imaged 3-D volume 150, such as a patient, having a real density function characterized by the patient's image. The Density function of volume 150 is analogous to the above mentioned density function ƒ(x,y,z) of imaged volume 106 (FIG. 4). The imaged volume and its associated density function can be, for example, Fourier transformed, as shown by arrow 151, to a corresponding 3-D k-space data set pictorially represented by 3-D k-space volume 152.

In accordance with the present technique, a plane 154 is selected from k-space volume data 152, such that the plane is oriented in a desired direction corresponding to an ultimate viewing angle of the volume 150. Selecting k-space data along plane 154 leads, as shown by arrow 155, to a k-spaced data slice 156 obtained from of k-space volume 152. Accordingly, operating with an inverse transform, such as with an IFFT, on k-space data slice 156 results in a real 2-D projection view 158 of volume 150 along the desired direction. Projection view 158 of the patient's volume 150 may include anatomical features, e.g., internal organs and/or skeletal structures, displayed in a manner similar to an X-ray view, projected along the corresponding desired direction.

Accordingly, the present method provides projection views, such as projection 158, forming 2-D X-ray like images that could provide information relating to anatomical features and/or to certain pathologies that otherwise are not accessible with existing MR imaging methods. The present method may also improve efficiency of image acquisitions in near real time. For example, in some embodiments, the present technique may be used to program rf readout, via pulse sequencing, such that only rf signals related to the selected 2-D k-space plane (e.g., plane 140, FIG. 5) are readout during image acquisitions. In this manner, the 2-D k-space data is leveraged to provide a rapid feedback mechanism, whereby 2-D projections may be rapidly fed to a host/console machine of the MR device. This also may enable rapid-down selection of regions of interest, such as specific anatomies or pathologies.

Figure 7:
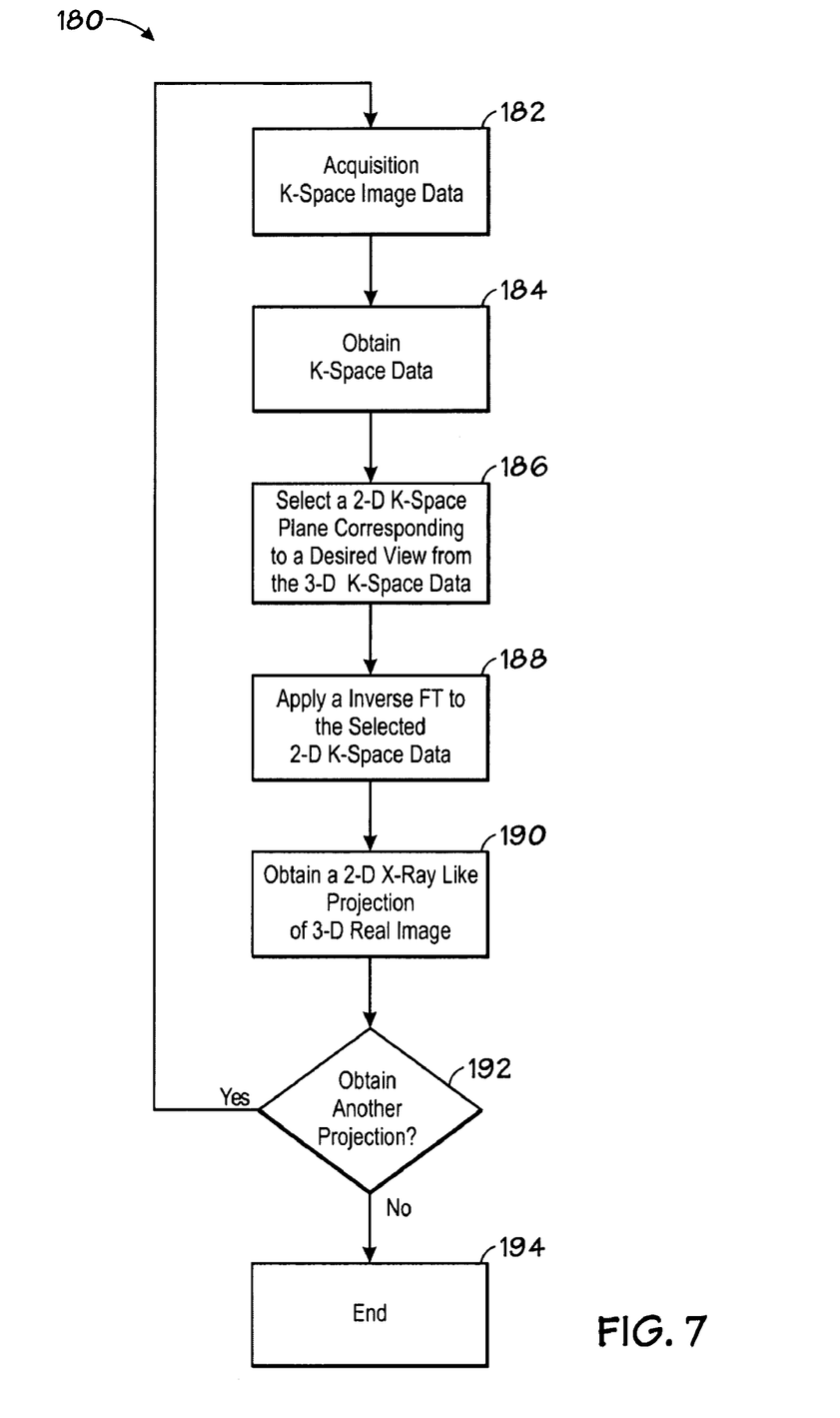
FIG. 7 is a flow chart of a method for processing an image in accordance with an embodiment of the present technique.

FIG. 7 a is flow chart summarizing a method of forming 2-D and 3-D MRI images utilizing MRI k-space data and the Fourier projection-slice theorem, in accordance with an exemplary embodiment of the present technique. Accordingly, method 180 begins at step 182 in which image data is initially acquired in k-space, as typically acquired by an MR device. Thereafter, the method proceeds to step 184 in which 3-D k-space data of an image is obtained using techniques such as those described above. Next, the method proceeds to step 186 which includes selecting a 2-D k-space slice/plane from the 3-D k-space data obtained in step 184. The selection of the 2-D plane ultimately corresponds to a desired viewing angle of an imaged object, as described above. Thereafter, the method proceeds to step 188 in which an IFFT is applied to the selected 2-D slice obtained at step 186. In so doing, at step 190 a 2-D X-ray like image is obtained representing a 2-D projection a of 3-D volume at the desired viewing angle. While in the present embodiment an IFFT may be used to revert the projection in k-space to the projection in real coordinate space, other embodiments may utilize other transformations including Hartley and/or a discrete cosine transforms.

As will be appreciated by those skilled in the art, the act of step 190 may further include image processing and enhancing techniques, such as shaded volume rendering and image filtering, providing more detail of certain physical features of the MR image. While in some embodiments method 180 may terminate at step 190, that is, upon obtaining a 2-D projection of the imaged object, in the illustrated embodiment method 180 progresses from step 190 to decision junction 192. Accordingly, decision junction 192 determines whether additional 2-D projections have been acquired. If so, the method terminates at step 194. If not, the method loops back to step 182 where for further image acquisitions.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for processing an image, comprising:
    acquiring image data in frequency space (k-space) of an imaged volume;
    obtaining a three-dimensional (3-D) k-space volume representative of the imaged volume based on the acquired k-space data;
    selecting a two-dimensional (2-D) plane from the 3-D k-space volume; and
    applying an inverse Fourier transform to the selected 2-D plane to obtain a real 2-D projection of the imaged volume.

2. The method of claim 1, comprising applying an inverse Fourier transform, an inverse Hartley transform, an inverse cosine transform, or a combination thereof to the selected 2-D plane to obtain a real 2-D projection of the imaged volume.

3. The method of claim 1, wherein acquiring data in k-space comprises magnetic resonance (MR) multi-channel acquisition.

4. The method of claim 1, wherein obtaining the 3-D k-space volume comprises using spin-echo, single slab of T1 and T2 weighted images.

5. The method of claim 1, comprising selecting the 2-D plane in k-space so as to form the real 2-D projection at an oblique angle.

6. The method of claim 1, wherein the real 2-D projection is obtained using the Fourier projection slice theorem.

7. A method for processing an image, comprising:
acquiring image data in k-space of an imaged volume;
obtaining a three-dimensional 3-D k-space volume representative of the imaged volume based on the acquired k-space data;
selecting a 2-D plane from the 3-D k-space volume;
obtaining multiple sequential real 2-D projections of the imaged volume using corresponding multiple sequential selected 2-D planes from the 3-D k-space volume; and
applying an inverse Fourier transform to the selected 2-D plane to obtain a real 2-D projection of the imaged volume.

8. The method of claim 1, wherein the real 2-D projection forms an X-ray like image of the imaged volume.

9. The method of claim 1, comprising enhancing the real 2-D projected image using shaded volume rendering and/or image filtering techniques.

10. The method of claim 1, comprising acquiring radio frequency (rf) signals of image data such that readout of the acquired rf signals corresponds only to data comprising the selected 2-D plane.

11. A method of processing an image, comprising:
acquiring image data in frequency space (k-space) of an imaged volume;
obtaining three-dimensional (3-D) k-space volume representative of the imaged volume based on the acquired k-space data; and
applying the Fourier Projection-slice theorem to the 3-D k-space volume to obtain a two-dimensional (2-D) projection plane in spatial coordinates representing a projection of the imaged volume.

12. The method of claim 11, wherein applying the Fourier Projection-slice theorem comprises applying an inverse Fourier transform, an inverse Hartley transform, an inverse cosine transform, or a combination thereof.

13. The method of claim 11, wherein the 2-D projection plane in spatial coordinates is disposed at an oblique angle with respect to the imaged volume.

14. The method of claim 11, wherein acquiring data in k-space comprises magnetic resonance (MR) multi-channel acquisition.

15. The method of claim 11, wherein obtaining the 3-D k-space volume comprises using spin-echo, single slab of T1 and T2 weighted images.

16. A magnetic resonance imaging (MRI) system, comprising:
means for acquiring MR signals in frequency space (k-space) of an imaged volume;
means for obtaining a 3-D k-space volume from the MR signals; and
means for projecting a real 2-D plane in spatial coordinates from the 3-D k-space volume, wherein the 2-D plane comprises a projection of the imaged volume.

17. The method of claim 16, wherein means for projecting the 2-D plane in spatial coordinates comprise applying a Fourier Projection-slice theorem to the 3-D k-space volume.

18. The method of claim 16, comprising means for applying an inverse Fourier Transform, an inverse Hartley Transform, an inverse cosine transform, or a combination thereof.

19. The method of claim 16, comprising means for processing the acquired MR signals to obtain a real 2-D image.

20. The method of claim 16, comprising means for accessing the acquired MR signals in k-space.

* * * * *

UNITED STATES PATENT AND TRADEMARK OFFICE
CERTIFICATE OF CORRECTION

| | | |
|---|---|---|
| PATENT NO. | : 7,471,086 B2 | Page 1 of 1 |
| APPLICATION NO. | : 11/788444 | |
| DATED | : December 30, 2008 | |
| INVENTOR(S) | : Mullick | |

It is certified that error appears in the above-identified patent and that said Letters Patent is hereby corrected as shown below:

In Column 8, Lines 27-28, in Equation (2), delete "$F(K_k + K_y + K_z)$" and insert -- $F(K_x + K_y + K_z)$ --, therefor.

Signed and Sealed this

Twenty-third Day of November, 2010

David J. Kappos
*Director of the United States Patent and Trademark Office*